United States Patent [19]

Shimizu et al.

[11] Patent Number: 4,721,664
[45] Date of Patent: Jan. 26, 1988

[54] SILICON FILM DEPOSITION FROM MIXTURE OF SILANES

[75] Inventors: Isamu Shimizu, Yokohama; Kyosuke Ogawa; Eiichi Inoue, both of Tokyo, all of Japan

[73] Assignee: Canon Kabushiki Kaisha, Tokyo, Japan

[21] Appl. No.: 867,624

[22] Filed: May 27, 1986

Related U.S. Application Data

[63] Continuation of Ser. No. 674,722, Nov. 26, 1984, abandoned, which is a continuation of Ser. No. 350,613, Feb. 22, 1982, abandoned.

[30] Foreign Application Priority Data

| Mar. 9, 1981 | [JP] | Japan | 56-33566 |
| Mar. 9, 1981 | [JP] | Japan | 56-33567 |
| Mar. 16, 1981 | [JP] | Japan | 56-37440 |

[51] Int. Cl.$^4$ ............................................. G03G 5/085
[52] U.S. Cl. ....................................... 430/128; 430/85
[58] Field of Search .................... 430/84, 95, 128, 85

[56] References Cited

U.S. PATENT DOCUMENTS

| 4,196,438 | 4/1980 | Carlson | 427/39 X |
| 4,202,928 | 5/1980 | Staebler | 427/39 X |
| 4,226,643 | 10/1980 | Carlson | 427/39 X |
| 4,226,898 | 10/1980 | Ovshinsky et al. | 427/86 X |
| 4,265,991 | 5/1981 | Hirai et al. | 430/84 X |
| 4,292,343 | 9/1981 | Plaettner et al. | 427/39 |
| 4,356,246 | 10/1982 | Tabei et al. | 427/74 X |
| 4,363,828 | 12/1982 | Brodsky et al. | 427/39 |

Primary Examiner—John L. Goodrow
Attorney, Agent, or Firm—Fitzpatrick, Cella, Harper & Scinto

[57] ABSTRACT

A process for producing a photoconductive member comprises forming a photoconductive layer on a substrate for formation of a photoconductive layer by introducing starting substances for formation of a photoconductive layer under gaseous state into a deposition chamber maintained under a desired reduced pressure and exciting discharging under the gas atmosphere of said starting substances, characterized in that said starting substances are constituted of at least two compunds selected from the group consisting of the compounds of the formula:

$$Si_nH_{2n+2} \qquad (A)$$

wherein n is a positive integer and the compounds of the formula:

$$Si_mH_lX_k \qquad (B)$$

wherein m and k are positive integers, l is 0 or a positive integer, $l+k=2m+2$, and X represents a halogen atom, n and m being called "order number" hereinafter, and said starting substances to be introduced into said deposition chamber being controlled in amounts such that the proportion of the total of high order compounds is at least 1 vol. % based on the total of the minimum order compounds, the minimum order compound being one whose order number is the minimum among order numbers of said at least two compounds, the high order compound being one whose order number is higher than the order number of the minimum order compound.

15 Claims, 2 Drawing Figures

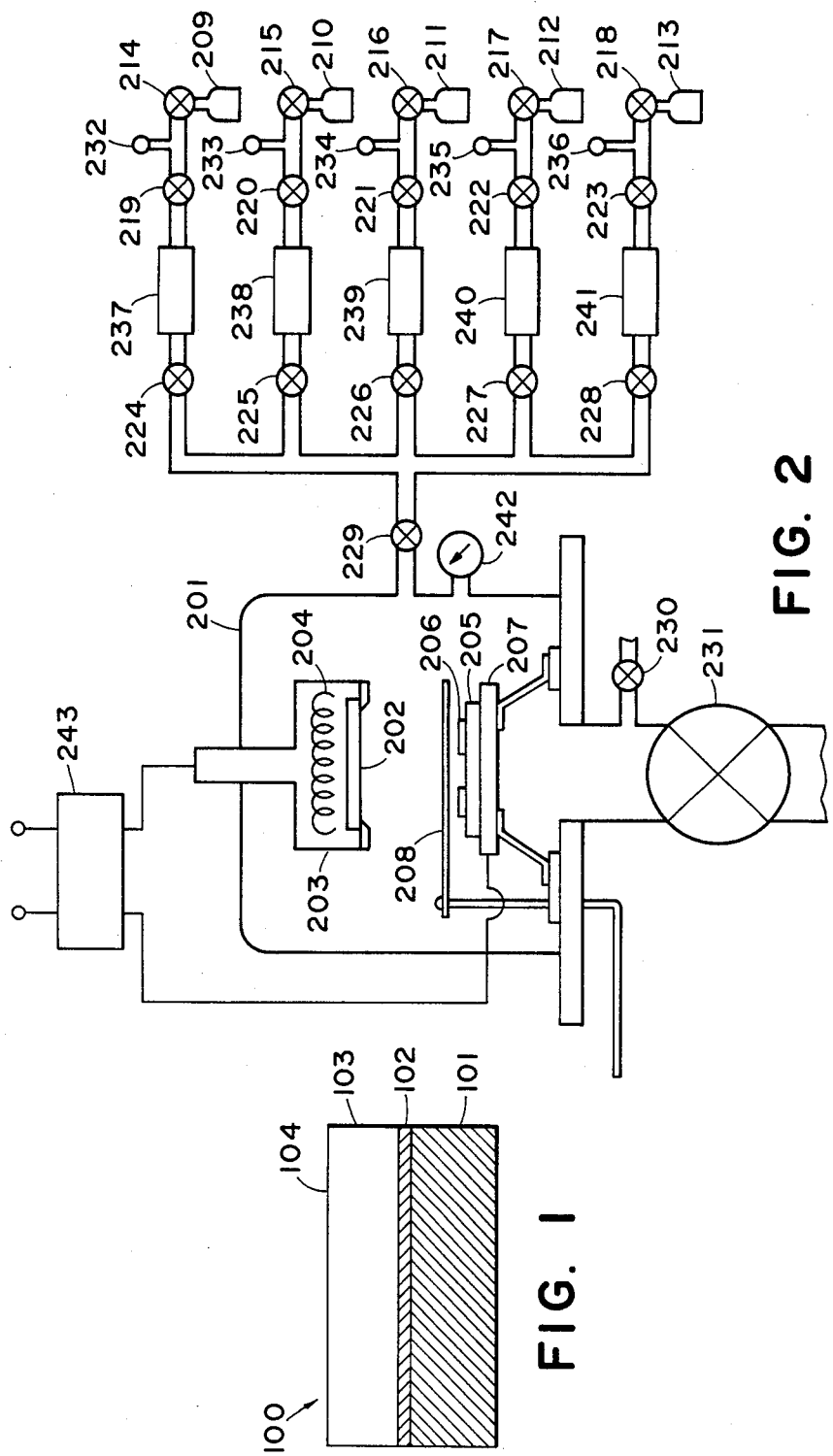

SILICON FILM DEPOSITION FROM MIXTURE OF SILANES

This is a continuation of application Ser. No. 674,722, filed Nov. 26, 1984, now abandoned, which is a continuation of application Ser. No. 350,613, filed Feb. 22, 1982, now abandoned.

BACKGROUND OF THE INVENTION

1. Field of the Invention

This invention relates to a process for producing a photoconductive member effective for formation of a photoconductive layer on a given substrate by utilization of discharging such as glow discharging or arc discharging.

2. Description of the Prior Art

When it is desired to form a photoconductive layer having desirable characteristics on a given substrate by utilization of a plasma excited by glow discharging of a gaseous starting substance for formation of a photoconductive layer constituted of, for example, an amorphous material having a matrix of silicon atoms in a deposition chamber which can be reduced in pressure, particularly in the case of a layer with a large area, it is very difficult to increase the layer formation rate, as compared with visual vacuum deposition methods, while controlling the layer thickness uniformly over the whole area and also uniformly the physical characteristics such as electrical, optical and electro-optic characteristics as well as the quality of the product.

For example, when an amorphous silicon layer containing at least one of hydrogen atoms or halogen atoms (X) [hereinafter abridged as "a-Si(H, X)"] is intended to be formed on a substrate by decomposition of a gas such as $SiH_4$, $Si_2H_6$ or $SiF_4$ or a mixture of $SiH_4$ and $SiF_4$ using a discharging energy for utilization of electrical properties of the resulting layer, the electrical characteristics of the layer are greatly dependent on the layer deposition rate and the substrate temperature upon forming the layer. Therefore, for the purpose of obtaining uniform electrical characteristics and improved layer quality over the entire region of the layer, it is necessary to lower the layer deposition rate and elevate the substrate temperature.

On the other hand, for improvement of productivity and mass production capability, it may be considered to increase the discharging power and gas flow amount for increase of the layer deposition rate. But, when discharging power and/or the gas flow amount is increased for increase of the layer deposition rate, the layer formed will markedly tend to be lowered in electrical, optical and photoconductive characteristics and increased in dependency of such characteristics on work environments, whereby it is very difficult under the present situation to form a layer of good quality. Thus, for the purpose of commercial production of a photoconductive member having a photoconductive layer constituted of an amorphous material containing a matrix of silicon atoms, it is necessary to improve the productivity and mass production capability, including reproducibility, while also keeping good and uniform layer quality closely correlated with photosensitivity, characteristics during repeated usage and the characteristics dependency on the environmental conditions employed.

SUMMARY OF THE INVENTION

The present invention has been accomplished in view of the above points and an object of the present invention is to provide a process for producing a photoconductive member which is very excellent in productivity and mass production capability and also can give easily a photoconductive layer very excellent in various respects, including electrical, optical and photoconductive characteristics, layer quality as well as bulk density and filling characteristic of the layer.

It is also another object of the present invention to provide a process for producing a photoconductive member, by which there can be produced economically at high efficiency and high speed with good reproducibility a layer having substantially uniform physical characteristics and layer thickness over the whole region, even in the case of a layer with a large area, which is also excellent photoconductive and electrical characteristics under the environmental conditions employed, especially under conditions of high humidity and high temperature.

According to the present invention, there is provided a process for producing a photoconductive member, which comprises forming a photoconductive layer on a substrate for formation of a photoconductive layer by introducing starting substances for formation of a photoconductive layer under gaseous state into a deposition chamber maintained under a desired reduced pressure and exciting discharging under the gas atmosphere of said starting substances, characterized in that said starting substances are constituted of at least two compounds selected from the group consisting of the compounds of the formula:

$$Si_nH_{2n+2} \quad (A)$$

wherein n is a positive integer and the compounds of the formula:

$$Si_mH_lX_k \quad (B)$$

wherein m and k are positive integers, l is 0 or a positive integer, $l+k=2m+2$, and X represents a halogen atom, n and m being called "order number" hereinafter, and said starting substances to be introduced into said deposition chamber being controlled in amounts such that the proportion of the total of high order compounds is at least 1 vol.% based on the total of the minimum order compounds, the minimum order compound being one whose order number is the minimum among order numbers of said at least two compounds, the high order compound being one whose order number is higher than the order number of the minimum order compound.

BRIEF DESCRIPTION OF THE DRAWINGS

FIG. 1 shows a schematic illustration indicating the layer-structure of one embodiment of the photoconductive member prepared according to the process of the present invention; and FIG. 2 a schematic illustration indicating one example of a device to be used for practicing the process of the present invention.

DETAILED DESCRIPTION OF THE PREFERRED EMBODIMENTS

In the present invention, as the compounds represented by the formula (A) or (B), there may be employed those which are gaseous under the conditions of normal temperature and normal pressure or readily gasifiable at least under the layer forming conditions, since they are required to be introduced under gaseous state for convenience of production and transport of starting materials into a deposition chamber for formation of the photoconductive layer.

The compounds represented by the formula (A) or (B) in the present invention are used as starting substances for formation of Si as the constituent atom in the photoconductive layer to be prepared. More specifically, as the compounds represented by the formula (A), there may effectively be employed gaseous or gasifiable silanes such as $SiH_4$, $Si_2H_6$, $Si_3H_8$, $Si_4H_{10}$, $Si_5H_{12}$, $Si_6H_{14}$, $Si_7H_{16}$, $Si_8H_{18}$, etc.

As the compounds represented by the formula (B), there may effectively be employed $SiX_4$, $Si_2X_6$, $Si_3X_8$, $SiHX_3$, $SiH_2X_2$, $SiH_3X$ (wherein X is F, Cl, Br, I), as exemplified by $SiH_4$, $SiCl_4$, $SiBr_4$, $SiI_4$, $Si_2F_6$, $Si_2Cl_6$, $Si_2Br_6$, $Si_2I_6$, $Si_3F_8$, $Si_3Cl_8$, $SiHF_3$, $SiHCl_3$, $SiHBr_3$, $SiHI_3$, $SiH_2F_2$, $SiH_2Cl_2$, $SiH_3F$, $SiH_3Cl$ etc.

In the present invention, the starting substances for constitution of the photoconductive layer are so selected that there may be contained at least two kinds of the compounds selected from either one of the groups consisting of the compounds represented by the formula (A) or (B), and the selected starting substances are introduced into a deposition chamber under gaseous state, followed by excitation of discharging such as glow discharge or arc discharge in a gas atmosphere of the starting materials thereby to form a photoconductive layer on a substrate.

In the following description, n and m are called "order number". A minimum order compound is one whose order number is the minimum among order numbers of the compounds respresented by formulas (A) and (B). A high order compound is one whose order number is higher than the order number of the minimum order compounds.

When the starting substances in the present invention are constituted of at least two kinds of the compounds selected from the compounds represented by formula (A), among selected compounds, $Si_2H_6$, $Si_3H_8$ and $Si_4H_{10}$ are preferable to constitute a group of high order compounds with regard to n. They may be employed as a mixture. Alternatively, at least one of them is used as a principal component in combination with other compounds with n of 5 or more so as to constitute a group of high order compounds with high order of n.

In the present invention in another embodiment as the starting substance, there are employed, at least two compounds selected from 'A' and 'B', wherein 'A' is $SiH_pX_q$, wherein p is 0 or a positive integer, q is a positive integer and (p+q) is 4 and 'B' is $Si_rH_sX_t$, wherein r is a positive integer of at least 2, s is 0 or a positive integer, t is a positive integer and (t+s) is (2r+2) and X is halogen.

In particular, a mixed system wherein either one or both of $Si_3H_8$ or $Si_4H_{10}$ constituting a group of high order compounds with higher order of n is used as the principal components in combination with $Si_2H_6$ as the compound with the minimum order of n is preferred.

Next to such mixed system, it is also preferred to use a mixed system wherein $SiH_4$ is employed in place of $Si_2H_6$ as the compound with the minimum order of n and at least one of $Si_2H_6$, $Si_3H_8$ and $Si_4H_{10}$ constituting the group of higher order compounds with higher n orders are selected as the principal component.

When the starting substance in the present invention is constituted of at least two kinds of the compounds selected from the compounds represented by the formula (B), among selected compounds, $Si_2F_6$, $Si_2Cl_6$ and $Si_3F_8$ are preferable to constitute a group of high order compounds with higher orders of m. They may be employed as a mixture. Alternatively, at least one of them can be used as a principal component in combination with other high order compounds with higher orders of m so as to constitute a mixture of high order compounds with higher orders of m.

In particular, a mixed system wherein either one, two or all of $Si_2F_6$, $Si_2Cl_6$ and $Si_2Br_6$ consisting a group of high order compounds with higher order of m is used as the principal components are $SiF_4$ or $SiCl_4$ as the compound with the minimum order of m is preferred.

In the present invention, as the starting substances for formation of the photoconductive layer, at least two kinds of compounds with different number of silicon atoms are selected from the groups of compounds represented by the formulas (A) and (B), and these selected compounds are introduced into a deposition chamber at a ratio such that the proportion of the high compounds having higher order of either n or m than the compound with the minimum value of either n or m may generally be 1 vol% or more relative to the minimum compound with the minimum order. The electric discharge is conducted in a mixed gas atmosphere of such constitution to thereby form the photoconductive layer. The proportion should more preferably be at least 5 vol.% and optimally 10 vol% or more.

The upper limit of the aforesaid proportion, which may optimally determined depending on the kinds of the compounds employed for constitution of the mixed system, is generally 99 vol.%, preferably 97 vol.%.

In the present invention, when at least two compounds selected from the above formulas, (A) and (B), are introduced into a deposition chamber, they may previously be mixed at a ratio as specified above before introduction into the chamber or alternatively they may separately be introduced into the chamber in amounts corresponding to such a ratio.

Typical examples of combinations of two or more kinds of compounds selected from those represented by the above formulae (A) and (B) are listed in Table 1, Table 2 and Table 3.

In Table 1 and Table 2, there are shown examples when at least two kinds of compounds are selected from those of the formula (A).

In these exemplary combinations, combinations in which the compound represented by the formula (B) is added are also another preferable combinations, and in such a case, compounds of the formula (B) preferably employed are $SiF_4$ and $SiCl_4$ as the compound with the minimum order of m, and $Si_2Cl_6$, $Si_2Br_6$ and $Si_3F_8$ with higher m orders.

Table 3 shows examples when at least two kinds of compounds are selected from those of the formula (B).

In these exemplary combinations, combinations in which the compound represented by the formula (A) is added are also another class of preferred combinations, and in such a case, preferable compounds of the formula (A) are SiH₄ and Si₂H₆ as the minimum order compound with the minimum order of n, and high order compounds with n of 2 or more, particularly 2, 3, 4 and 5 as high order compounds.

In examples of combinations shown in Table 1 and Table 2, more preferable examples are those of 1 to 27, particularly 17 to 27, in which more marked effects are exhibited.

In examples of combinations shown in Table 3, more preferable examples are those of A1 to A10, especially A1 to A3 and A5 to A8, in which more marked effects are exhibited.

In examples shown in Table 1 to Table 3, there are shown examples in which at least two kinds of compounds are selected from either one of the group of the formula (A) or the formula (B). It is also possible in the present invention to select at least one compound from each group of the compounds of the formula (A) and the formula (B) as another preferred embodiment.

As substances which can be such atmospheric gases, there may be mentioned rare gases such as He, Ne, Ar, etc., halogenic gases such as fluorine, chlorine, bromine or iodine, gaseous or gasifiable interhalogen compounds such as BrF, ClF, ClF₃, BrF₅, BrF₃, IF₇, IF₅, ICl, IBr, etc., hydrogen halide gases such as HF, HCl, HBr, etc., and H₂.

Among these substances for atmospheric gas, rare gases and H₂ gas may particularly effectively be employed. As other starting gases for formation of layers, there may be mentioned substances containing impurity atoms which control the conduction type of the photoconductive layer formed as constituent element, which are gaseous or readily gasifiable.

In the process for production of photoconductive members according to the present invention, it is possible to effect layer formation at by far higher rate and more economically and to increase the substrate temperature and discharging power, as compared with the methods of prior art, in case that photoconductive layers of the same characteristics and layer quality are to be produced.

For example, when a photoconductive layer having the characteristics and the layer quality for accomplishing the purposes of the present invention is to be obtained, the substrate temperature can be 150° C. or higher and the discharging power 100 W or higher.

Referring now to a typical example of a photoconductive member to be produced according to the process of the present invention, the present invention is described in further detail.

TABLE 1

| Number of n | \multicolumn{27}{c}{Examples of combinations:} |
|---|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
| 1 | O | O | O | O | O | O | O | O | O | O | O | O | O | O | O | O | | | | | | | | | | | |
| 2 | O | | | | | O | O | O | | | | O | O | O | | O | O | O | O | O | O | O | O | | | | |
| 3 | | O | | | | O | | | O | O | | O | O | | O | O | | O | | | O | O | | O | O | O | |
| 4 | | | O | | | | O | O | | O | O | | O | O | O | | O | | O | | | O | O | O | | O | O |
| 5 | | | | O | | | | O | | O | | O | O | O | | | O | | | O | O | O | | | O | O | O |

TABLE 2

| Number of n | \multicolumn{27}{c}{Examples of combinations:} |
|---|---|---|---|---|---|---|---|---|---|---|---|---|---|---|---|---|---|---|---|---|---|---|---|---|---|---|---|
| | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 |
| 1 | O | O | O | O | O | O | O | O | O | O | O | O | O | O | O | O | | | | | | | | | | | |
| 2 | O | | | | | O | O | O | | | | O | O | O | | O | O | O | O | O | O | O | O | | | | |
| 3 | | O | | | | O | | | O | O | | O | O | | O | O | | O | | | O | O | | O | O | O | |
| 4 | | | O | | | | O | O | | O | O | | O | O | O | | O | | O | | | O | O | O | | O | O |
| 5 | | | | | | | | O | | O | | | O | O | O | | | O | | O | O | O | | | O | O | O |
| 6 | O | O | O | O | O | O | | O | O | | O | O | | O | O | O | O | O | O | O | O | O | O | O | O | O | O |
| 7 | | | | | | | O | | | | | | O | | | O | | | | O | O | | | | | | |
| 8 | | | | | | | | | | O | | | | | | O | | | | | | | | | | | |

TABLE 3

| Compounds | A1 | A2 | A3 | A4 | A5 | A6 | A7 | A8 | A9 | A10 | A11 | A12 | A13 | A14 | A15 | A16 | A17 |
|---|---|---|---|---|---|---|---|---|---|---|---|---|---|---|---|---|---|
| SiF₄ | O | | O | O | | | | O | | | O | O | O | O | | | |
| SiCl₄ | | O | | | | | | | | | | | | | | O | |
| SiBr₄ | | | O | | | | | | | | | | | | | | O |
| SiHF₃ | | | | | O | O | | | O | | | | | | O | | |
| SiHCl₃ | | | | | | | O | | | | | | | | | O | |
| SiHBr₃ | | | | | | | | O | | | | | | | | | O |
| SiHI₃ | | | | | | | | | | | | | O | O | | | |
| SiH₃F | | | | | | | | | O | O | | | | | | | |
| SiH₃Cl | | | | | O | | | | | | | | | | | | |
| Si₂F₆ | O | | | | O | O | O | | O | O | O | O | | O | | | |
| Si₂Cl₆ | | O | | | | | | O | | | | | O | | O | | |
| Si₂Br₆ | | | O | | | | | O | | | | | | | | | O |
| Si₃F₈ | | | | O | O | O | | | | | | | | | | O | |

In the present invention, the mixed gas system of the starting material may be used as a mixture with an atmospheric gas or other starting gas for layer formation in order to obtain a desired concentration or a gas pressure in a deposition chamber for formation of a photoconductive layer.

As an atmospheric gas to be used in the present invention, there is adopted a gas having no deleterious effect on the photoconductive layer formed, and being constituted of atoms which is one constituent of said layer, or an entirely inert gas.

FIG. 1 shows a schematic sectional view for illustration of a typical example of the photoconductive member prepared according to the present invention.

The photoconductive member 100 shown in FIG. 1 is an embodiment applicable for electrophotography or an image-pickup device, comprising a substrate 101 for photoconductive member, an intermediate layer 102 which may optionally be provided on said substrate and a photoconductive layer 103 provided according to the process of the present invention.

The substrate 101 may be either electroconductive or insulating. As the electroconductive material, there may be mentioned metals such as NiCr, stainless steel, Al, Cr, Mo, Au, Ir, Nb, Ta, V, Ti, Pt, Pd, etc., or alloys thereof.

As insulating substrates, there may conventionally be used films or sheets of synthetic resins, including polyesters, polethylene, polycarbonates, cellulose acetates, polypropylene, polyvinyl chloride, polyvinylidene chloride, polystyrene, polyamides, etc., glasses, ceramics, papers and the like. These insulating substrates may suitably have at least one surface subjected to electroconductive treatment, and it is desirable to provide other layers on the side to which said electroconductive treatment has been applied.

For example, electroconductive treatment of a glass can be effected by providing a thin film of NiCr, Al, Cr, Mo, Au, Ir, Nb, Ta, V, Ti, Pt, Pd, In$_2$O$_3$, SnO$_2$, ITO(In$_2$O$_3$+SnO$_2$), etc., thereon. Alternatively, a synthetic resin film such as polyester film can be subjected to the electroconductive treatment on its surface by the vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby electroconductivizing the surface. The substrate may be shaped in any form such as cylinders, belts, plates or others, and its form may be determined as desired. For example, when the photoconductive member 100 in FIG. 1 is to be used as an image-forming member for electrophotography, it may desirably be formed into an endless belt or a cylinder for use in continuous high speed copying.

The intermediate layer 102 is constituted of a matrix of, for example, silicon atoms, and carbon atoms, nitrogen atoms or oxygen atoms, containing optionally hydrogen atoms or halogen atoms (X), thus being constituted of an amorphous material which is non-photoconductive, and has the function to effectively bar injection of carriers from the side of the substrate 101 into the photoconductive layer 103 and to easily permit photocarriers, which are generated in the photoconductive layer 103 by irradiation of an electromagnetic wave and migrate toward the side of the substrate 101, to be passed from the side of the photoconductive layer 103 to the side of the substrate 101.

For formation of an intermediate layer 102, the glow discharge method can be employed since it permits continuous operation including formation of the photoconductive layer 103. In such a case, a starting gas for formation of an intermediate layer, optionally admixed with a diluting gas such as He or Ar at a predetermined ratio, is introduced into a deposition chamber for vacuum deposition in which the substrate 101 is placed, wherein gas plasma is formed by excitation of glow discharging in the atmosphere of the gas introduced thereby to form the intermediate layer 102 on said substrate 101.

Starting substances effectively used as the starting gases for formation of the intermediate layer 102 may include hydrogenated silicon such as silanes as exemplified by SiH$_4$, Si$_2$H$_6$, Si$_3$H$_8$, Si$_4$H$_{10}$, etc.; gaseous or gasifiable nitrogen, nitrogen compounds such as nitrides or azides containing N or N and H as constituent atoms, as exemplified by nitrogen (N$_2$), ammonia (NH$_3$), hydrazine (H$_2$NNH$_2$), hydrogen azide (HN$_3$), ammonia azide (NH$_4$N$_3$); compounds containing C and H as constituent atoms such as saturated hydrocarbons having 1 to 5 carbon atoms, ethylenic hydrocarbons having 2 to 5 carbon atoms and acetylenic hydrocarbons having 2 to 4 carbon atoms, more specifically, including saturated hydrocarbons such as methane (CH$_4$), ethane (C$_2$H$_6$), propane (C$_3$H$_8$), n-butane (n-C$_4$H$_{10}$), pentane (C$_5$H$_{12}$), ethylenic hydrocarbons such as ethylene (C$_2$H$_4$), propylene (C$_3$H$_6$), butene-1 (C$_4$H$_8$), butene-2 (C$_4$H$_8$), isobutylene (C$_4$H$_8$), pentene (C$_5$H$_{10}$), acetylenic hydrocarbons such as acetylene (C$_2$H$_2$), methyl acetylene (C$_3$H$_4$), butyne (C$_4$H$_6$), etc.; and further oxygen (O$_2$), ozone (O$_3$), carbon monoxide (CO), carbon dioxide (CO$_2$), nitrogen monoxide (NO), nitrogen dioxide (NO$_2$), dinitrogen monoxide (N$_2$O), and the like.

These starting substances for formation of the intermediate layer 102 are suitably selected in formation of the layer so that the desired atoms may be incorporated as constituent atoms in the intermediate layer 102 formed.

As other substances than those mentioned above for constitution of the intermediate layer 102, there may also be employed electrically insulating metal oxides.

As electrically insulating metal oxides for constitution of the intermediate layer 102, there may preferably be employed TiO$_2$, Ce$_2$O$_3$, ZrO$_2$, HfO$_2$, GeO$_2$, CaO, BeO, P$_2$O$_5$, Y$_2$O$_3$, Cr$_2$O$_3$, Al$_2$O$_3$, MgO, MgO.Al$_2$O$_3$, SiO$_2$.MgO, etc. These materials may be used in combination of two or more kinds for formation of the intermediate layer 102.

Further, the aluminum layer 102 may also be provided on a substrate 101 which is made of aluminum or an aluminum alloy by subjecting the surface of such aluminum substrate or an aluminum alloy substrate to alumite or boemite treatment.

The intermediate layer 102 may have a thickness of generally in the range from 30 Å to 2$\mu$, preferably from 30 to 1000 Å, most preferably 50 to 600 Å.

The photoconductive layer 103 may be constituted of a-Si(H, X) having the semiconductor characteristics as shown below:

(1) p-type a-Si(H, X) . . . containing only acceptor or containing both donor and acceptor, with higher concentration of acceptor (Na);

(2) n-type a-Si(H, X) . . . containing only donor or containing both donor and acceptor, with higher concentration of donor (Nd);

(3) i-type a-Si (H, X) . . . Na≃Nd≃O or Na≃Nd.

The photoconductive layer 103 may have a thickness which may suitably be determined depending on the intended uses such as reading device, solid state image-pickup device, image-forming member for electrophotography, etc.

The photoconductive layer 103 has a thickness which is suitably determined as desired depending on the thickness of the intermediate layer so that both functions of the photoconductive layer 103 and the intermediate layer 102 may be fulfilled, and is generally some hundred to some thousand times as thick as the intermediate layer 102.

More specifically, the thickness is desired to be generally in the range of from 1 to 100μ, preferably from 2 to 50μ.

The content of H or X or (H+X) when both H and X are contained is desired to be generally in the range of from 1 to 40 atomic %, preferably 5 to 30 atomic %.

In order to make the photoconductive layer 103 n-type or p-type, it can be accomplished by adding impurities which control the conductive type, namely n-type impurity, p-type impurity or both impurities while controlling their amounts during formation of the layer. As impurities to be added into the photoconductive layer, there may preferably be employed as a p-type impurity an element in the group III A of the periodic table such as B, Al, Ga, In, Tl, etc., or as a n-type impurity an element in the group V A of the periodic table such as N, P, As, Sb, Bi, etc. Among them, B, Ga, P, Sb are especially preferred.

In the present invention, in order to produce the photoconductive layer having a desired conduction type, the content of an impurity to be added into the photoconductive layer may suitably be determined depending on the electrical as well as optical characteristics desired, but may be in the range of $3 \times 10^{-2}$ atomic % or less in the case of the impurity in the group III A of the periodic table, while it may be in the range of $5 \times 10^{-3}$ or less in the case of the impurity in the group V A of the periodic table.

For addition of an impurity into the photoconductive layer 103, a starting material for incorporation of an impurity may be introduced into the deposition chamber together with the principal starting substance for formation of a photoconductive layer 103 upon forming the layer. As starting materials for incorporation of such impurities, there may be employed those which are gaseous under normal temperature and normal pressure or readily gasifiable at least under the layer forming conditions. Specific examples of such starting substances for incorporation of impurities may include, for example, $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

As described above, according to the process for preparation of the photoconductive member of the present invention, there can be prepared economically and easily a photoconductive member with a large area which is markedly more excellent in physical characteristics, optical characteristics, electrical characteristics and electro-optic characteristics at higher efficiency and higher rate than the processes of the prior art with additional advantages of increased density of the layer itself, higher filling degree of the layer, excellent performance under highly humid and high temperature environments as well as uniformity of such characteristics and uniform thickness over the entire region of the film.

In particular, the photoconductive member prepared according to the process of the present invention can be made available its characteristics to full extent upon applying to electrophotography.

EXAMPLE 1

Using a device as shown in FIG. 2 placed in a clean room which had been completely shielded, an image-forming member for electrophotography was prepared according to the following procedures.

A molybdenum plate (substrate) 202 of 10 cm square having a thickness of 0.5 mm, whose surface had been cleaned, was fixed firmly on a fixing member 203 disposed at a predetermined position in a deposition chamber 201. The targets 205, 206 employed were constituted of a high purity polycrystalline silicon (99.999%) provided on high purity graphite (99.999%), with an area ratio of silicon to graphite being 1:9. The substrate 202 was heated by a heater 204 within the fixing member 203 which a precision of ±0.5° C. The temperature was measured directly at the backside of the substrate by an alumel-chromel thermocouple. Then, after confirming that all the valves in the system were closed, the main valve 231 was opened fully to evacuate once to about $5 \times 10^{-7}$ Torr (during this operation all the valves in the system were closed). Subsequently, the auxiliary valve 229, and then the outflow valves 224, 225, 228 were opened to remove sufficiently the gases in the flowmeters 237, 238, 241. Then, the outflow valves 224, 225, 228, and the auxiliary valve 229 were closed. The valve 218 of the bomb 213 containing Ar gas (purity: 99.999%) was opened to adjust the pressure at the outlet pressure gauge 236 at 1 kg/cm², whereupon the inflow valve 223 was opened, followed by gradual opening of the outflow valve 228 to introduce Ar gas into the deposition chamber 201. The outflow valve 228 was gradually opened until the indication on the Pirani gauge 242 became $5 \times 10^{-4}$ Torr. After the flow amount was stabilized under this state, the main valve 231 was gradually closed to narrow the opening until the pressure in the chamber became $1 \times 10^{-2}$ Torr. After confirming that the flowmeter 241 was stabilized, with the shutter 208 being opened, and then the high frequency power source 243 was turned on to input an alternate current of 13.56 MHz, 100 W between the targets 205, 206 and the fixing member 203. A layer was formed while monitoring flow rates so as to continue stable discharging under these conditions. After discharging was continued under these conditions for one minute, an intermediate layer with a thickness of 100 Å was formed. Then, the high frequency power source 243 was turned off for intermission of glow discharging. Subsequently, the outflow valve 228 and the inflow valve 223 were closed and the main valve 231 fully opened to discharge the gas in the deposition chamber 201 until it was evacuated to $5 \times 10^{-7}$ Torr. Then, the input voltage at the heater 204 was charged by elevating the input voltage while detecting the substrate temperature, until it was stabilized constantly at 400° C.

Then, after the auxiliary valve 229, then the outflow valve 228 were fully opened to exhaust gases sufficiently the flowmeter 241 to vacuum conditions. After the auxiliary valve 229 and the outflow valve 228 were closed, the valve 214 of the bomb 209 of $Si_2H_6$ gas (purity: 99.999%) containing 10 vol.ppm of $B_2H_6$ gas [hereinafter abridged as "$B_2H_6(10)/Si_2H_6$"], the valve 215 of the bomb 210 of $SiH_4$ gas (purity 99.999%) were opened to adjust the pressures at the outlet pressure gages 232 and 233, respectively, to 1 kg/cm², whereupon the inflow valves 219, 220, 223 were gradually opened to permit $B_2H_6(10)/Si_2H_6$ gas, $SiH_4$ gas, and Ar gas to flow into the flowmeters 237, 238 and 241, respectively. Subsequently, the outflow valves 224, 225, 228 were gradually opened, followed by gradual opening of the auxiliary valve 229. The inflow valves 219, 220 and 223 were adjusted thereby so that the flow amount ratio of $B_2H_6(10)/Si_2H_6:SiH_4:Ar$ was 30:1:69. Then, while carefully reading the Pirani gauge 242, the opening of the auxiliary valve 229 was adjusted and it was opened to the extent until the inner pressure in the chamber 201 became $1 \times 10^{-2}$ Torr. After the inner pressure in the chamber 201 was stabilized, the main valve 231 was gradually closed to narrow its opening until the indication on the Pirani gauge 242 became 0.2 Torr. After confirming that the gas feeding and the inner pressure were stable, the shutter 208 (which was also an electrode) was closed and then the switch of high frequency power source 243 was turned on to input a high frequency power of 13.56 MHz between the electrode 203 and the shutter 208, thereby generating glow discharge in the chamber 201 to provide an input power of 100 W. After glow discharging was continued for one hour to form a photoconductive layer, the heater 204 was turned off, with the high frequency power source 243 being also turned off, and the substrate was left to cool to 100° C., whereupon the outflow valves 224, 225, 228 and the inflow valves 219, 220, 223 were closed, with the main valve 231 fully opened, thereby to make the inner pressure in the chamber 201 to less than $10^{-5}$ Torr. Then, the main valve 231 was closed, the inner pressure in the chamber 201 was made atmospheric through the leak valve 230, and the substrate was taken out. In this case, the entire thickness of the layers formed was about $18\mu$.

The thus prepared image-forming member was placed in an experimental device for charging and exposure to light. Corona charging was effected at ⊕6.0 KV for 0.2 sec., and light exposure through a transmission type test chart by use of a tungsten lamp as light source at a dose of about 1.5 lux.sec.

Immediately thereafter, a ⊖ charged developer (containing toner and carrier) was cascaded on the surface of the member to obtain a good toner image on the member. When the toner image on the member was transferred on a transfer paper by corona charging at ⊕5.0 KV, there was obtained a clear image of high density, which was excellent in resolution as well as in gradation reproducibility.

Next, using the above image-forming member, corona charging was effected thereon at ⊖5.5 KV for 0.2 sec. in the experimental charging-exposure device, followed immediately by imagewise exposure at a dose of 1.5 lux.sec. Then, a ⊕ charged developer was cascaded on the surface of the member and transfer of the image and fixing effected on a transfer paper, whereby a very clear image was obtained.

From these results and the previous results, it can be seen that the image-forming member for electrophotography obtained in this Example has no dependency on the charging polarity but it is provided with the characteristics of a both-polarity image-forming member.

EXAMPLE 2

After intermediate layers were formed on molybdenum substrates according to the same procedure and under the same conditions as in Example 1, photoconductive layers were formed on the intermediate layers according to the same procedure and under the same conditions as in Example 1 except that the gases employed and the relative values of flow amounts were varied as shown in Table 4. When toner images were formed using the thus prepared image-forming members, better images were obtained in case of Sample A2 for the combination of corona charging effected at ⊖5.5 KV followed by imagewise exposure with a ⊕ charged toner.

On the contrary, better toner images were obtained in case of Sample B2 for the combination of corona charging at ⊕6.0 KV followed by imagewise exposure with a ⊖ charged toner.

TABLE 4

| Sample | Photoconductive layer | |
|---|---|---|
| | Gases employed for formation of photoconductive layer | Relative value of flow amount |
| A2 | $SiH_4$ | 1 |
| | $Si_2H_6$ | 30 |
| | Ar | 69 |
| B2 | $Si_3H_8$ | 30 |
| | $Si_2H_6$ containing 100 vol. ppm of $B_2H_6$ | 20 |
| | Ar | 50 |

EXAMPLE 3

After intermediate layers were formed on molybdenum substrates according to the same procedure and under the same conditions as in Example 1, photoconductive layers were formed on the intermediate layers according to the same procedure and under the same conditions as in Example 1 except that the gases employed (using increased number of bombs in FIG. 2, if necessary) and the relative values of flow amounts were varied as shown in Table 5.

The thus prepared image-forming members were examined from both aspects of producivity (deposition rate) and characteristics (image quality at high temperatures under high humidity, repeatability). The result revealed that it is necessary for accomplishment of the purposes of the present invention to form a photoconductive layer by use of a starting gas mixture in which high order compounds with higher order of n than that of the minimum order compound with the minimum order of n among those represented by the formula: $Si_nH_{2n+2}$ (wherein n is a positive integer) may be contained in an amount of at least 1 vol.% based on said minimum order compound.

TABLE 5

| Sample | Gases employed for formation of photoconductive layer | | Deposition rate of film (Å/sec.) | Reliability by 3 sec. cycle | Image quality after standing 1 hr. at high temperature (35° C., 85% RH) |
|---|---|---|---|---|---|
| | (relative flow amount value) | Atmospheric gas (flow amount relative to starting gas mixture) | | | |
| 3-1 | $SiH_4$(99.5) $Si_2H_6$(0.5) | Ar (30:70) | 10 | Δ | X |
| 3-2 | $SiH_4$(99) $Si_2H_6$(1) | Ar (30:70) | 10 | ○ | Δ |
| 3-3 | $SiH_4$(95) $Si_2H_6$(5) | Ar (30:70) | 15 | Δ | Δ |
| 3-4 | $SiH_4$(90) $Si_2H_6$(10) | Ar (30:70) | 20 | Δ | ○ |
| 3-5 | $SiH_4$(80) $Si_2H_6$(20) | Ar (30:70) | 22 | ○ | ○ |

TABLE 5-continued

| Sample | Gases employed for formation of photoconductive layer (relative flow amount value) | Atmospheric gas (flow amount relative to starting gas mixture) | Deposition rate of film (Å/sec.) | Reliability by 3 sec. cycle | Image quality after standing 1 hr. at high temperature (35° C., 85% RH) |
|---|---|---|---|---|---|
| 3-6 | $SiH_4(70)$ $Si_2H_6(30)$ | Ar (30:70) | 25 | ○ | ◉ |
| 3-7 | $SiH_4(50)$ $Si_2H_6(50)$ | Ar (30:70) | 30 | ○ | ◉ |
| 3-8 | $SiH_4(1)$ $Si_2H_6(99)$ | Ar (30:70) | 45 | ◉ | ◉ |
| 3-9 | $SiH_4(1)$ $Si_2H_6(99)$ | He (30:70) | 60 | ◉ | ◉ |
| 3-10 | $SiH_4(1)$ $Si_2H_6(99)$ | $H_2$ (30:70) | 70 | ○ | ○ |
| 3-12 | $SiH_4(1)$ $Si_2H_6(55)$ $Si_3H_8(44)$ | Ar (30:70) | 90 | ◉ | ◉ |
| 3-13 | $SiH_4(1)$ $Si_2H_6(44)$ $Si_3H_8(55)$ | Ar (30:70) | 95 | ◉ | ◉ |
| 3-14 | $SiH_4(1)$ $Si_2H_6(55)$ $Si_3H_8(44)$ | | 100 | ◉ | ◉ |
| 3-15 | $SiH_4(1)$ $Si_2H_6(64)$ $Si_3H_8(30)$ $Si_4H_{10}(5)$ | Ar (30:70) | 110 | ◉ | ◉ |
| 3-16 | $Si_2H_6(65)$ $Si_3H_8(30)$ $Si_4H_{10}(5)$ | Ar (30:70) | 115 | ◉ | ◉ |
| 3-17 | $Si_2H_6(70)$ $Si_3H_8(30)$ | Ar (30:70) | 115 | ◉ | ◉ |
| 3-18 | $Si_2H_6(70)$ $Si_3H_8(30)$ | | 100 | ◉ | ◉ |
| 3-19 | $Si_2H_6(1)$ $Si_3H_8(99)$ | Ar (30:70) | 120 | ◉ | ◉ |
| 3-20 | $Si_2H_6(65)$ $Si_3H_8(30)$ $Si_4H_{10}(5)$ | He (30:70) | 100 | ◉ | ◉ |

Standards for evaluation:
◉: Excellent
○: good
△: practically satisfactory
X: practically slightly inferior

EXAMPLE 4

An image-forming member for electrophotography was prepared according to the same procedure and under the same conditions as in Example 1 except for the conditions as shown in Table 6.

TABLE 6

| | Conditions for forming photoconductive layer | | |
|---|---|---|---|
| Gases employed | Flow amount (or ratio) | Discharging conditions | Layer thickness |
| $B_2H_6(10)/$ $Si_2F_6$ | 30 | 150 W | 20μ |
| $SiF_4$ | 1 | | |
| Ar | 69 | | |

The thus prepared image-forming member was placed in an experimental device for charging and exposure to light. Corona charging was effected at ⊕6.0 KV for 0.2 sec., and light exposure through a transmission type test chart by use of a tungsten lamp as light source at a dose of about 1.5 lux.sec.

Immediately thereafter, a ⊖ charged developer (containing toner and carrier) was cascaded on the surface of the member to obtain a good toner image on the member. When the toner image on the member was transferred on a transfer paper by corona charging at ⊕5.0 KV, there was obtained a clear image of high density, which was excellent in resolution as well as in gradation reproducibility.

Next, using the above image-forming member, corona charging was effected thereon at ⊖5.5 KV for 0.2 sec. in the experimental charging-exposure device, followed immediately by imagewise exposure at a dose of 1.5 lux.sec. Then, a ⊕ charged developer was cascaded on the surface of the member and transfer of the image and fixing effected on a transfer paper, whereby a very clear image was obtained.

From these results and the previous results, it can be seen that the image-forming member for electrophotography obtained in this Example has no dependency on the charging polarity but it is provided with the characteristics of a both-polarity image-forming member.

EXAMPLE 5

After intermediate layers were formed on molybdenum substrates according to the same procedure and under the same conditions as in Example 4, photoconductive layers were formed on the intermediate layers according to the same procedure and under the same conditions as in Example 4 except that the gases employed and the relative values of flow amounts were varied as shown in Table 7. When toner images were formed using the thus prepared image-forming members, better images were obtained in case of Sample A5 for the combination of corona charging effected at ⊖5.5 KV followed by imagewise exposure with a ⊕ charged toner.

On the contrary, better toner images were obtained in case of Sample B5 for the combination of corona charging at ⊕6.0 KV followed by imagewise exposure with a ⊖ charged toner.

the minimum order compound with the minimum order of m among those represented by the aforesaid formula $Si_mH_1X_k$ may be contained in an amount of at least 1 vol.% based on said minimum order compound. The standards for evaluation in Table 8 are the same as in Table 5.

TABLE 8

| Sample | Gases employed for formation of photoconductive layer | | Deposition rate of film (Å/sec.) | Repeatability by 3 sec. cycle | Image quality after standing 1 hr. at high temperature and humidity (35° C., 85% RH) |
|---|---|---|---|---|---|
| | Starting gases (relative flow amount value) | Atmospheric gas (flow amount relative to starting gas mixture) | | | |
| 6-1 | $SiF_4$(99.5) $Si_2F_6$(0.5) | Ar (30:70) | 10 | Δ | X |
| 6-2 | $SiF_4$(99) $Si_2F_6$(1) | Ar (30:70) | 10 | Δ | Δ |
| 6-3 | $SiF_4$(95) $Si_2F_6$(5) | Ar (30:70) | 15 | O | Δ |
| 6-4 | $SiF_4$(90) $Si_2F_6$(10) | Ar (30:70) | 20 | O | O |
| 6-5 | $SiF_4$(80) $Si_2F_6$(20) | Ar (30:70) | 22 | O | O |
| 6-6 | $SiF_4$(70) $Si_2F_6$(30) | Ar (30:70) | 25 | O | ⊚ |
| 6-7 | $SiF_4$(50) $Si_2F_6$(50) | Ar (30:70) | 30 | O | ⊚ |
| 6-8 | $SiF_4$(1) $Si_2F_6$(99) | Ar (30:70) | 45 | ⊚ | ⊚ |
| 6-9 | $SiF_4$(1) $Si_2F_6$(99) | He (30:70) | 60 | ⊚ | ⊚ |
| 6-10 | $SiF_4$(1) $Si_2F_6$(99) | $H_2$ (30:70) | 70 | O | O |
| 6-11 | $SiCl_4$(1) $Si_2Cl_6$(99) | Ar (30:70) | 45 | O | O |
| 6-12 | $SiBr_4$(1) $Si_2Br_6$(99) | Ar (30:70) | 45 | O | O |
| 6-14 | $SiHF_3$(1) $Si_2F_6$(99) | Ar (30:70) | 45 | O | O |
| 6-15 | $SiF_4$(1) $Si_2F_6$(80) $Si_3F_8$(19) | Ar (30:70) | 90 | O | O |

TABLE 7

| Sample | Photoconductive layer | |
|---|---|---|
| | Gases employed for formation of photoconductive layer | Relative value of flow amount |
| A5 | $SiF_4$ | 1 |
| | $Si_2F_6$ | 30 |
| | Ar | 69 |
| B5 | $Si_3F_8$ | 30 |
| | A mixture of $SiF_4$ and $Si_2F_6$, containing 100 vol. ppm of $B_2H_6$ | 20 |
| | Ar | 50 |

EXAMPLE 6

After intermediate layers were formed on molybdenum substrates according to the same procedure and under the same conditions as in Example 4, photoconductive layers were formed on the intermediate layers according to the same procedure and under the same conditions as in Example 4 except that the gases employed (using increased number of bombs in FIG. 2, if necessary) and the relative values of flow amounts were varied as shown in Table 8.

The thus prepared image-forming members were examined from both aspects of productivity (deposition rate) and characteristics (image quality at high temperatures under high humidity, repeatability). The result revealed that it is necessary for accomplishment of the object of the present invention to form a photoconductive layer by use of a starting gas mixture in which high order compounds with higher order of m than that of

EXAMPLE 7

An image-forming member for electrophotography was prepared according to the same procedure and under the same conditions as in Example 1 except for the conditions as shown in Table 9.

TABLE 9

| | Conditions for forming photoconductive layer | | |
|---|---|---|---|
| Gases employed | Flow amount (or ratio) | Discharging conditions | Layer thickness |
| $B_2H_6$(10)/ $Si_2H_6$ | 28 | | |
| $SiH_4$ | 1 | 150 W | 20μ |
| $SiF_4$ | 3 | | |
| Ar | 68 | | |

The thus prepared image-forming member was placed in an experimental device for charging and exposure to light. Corona charging was effected at ⊕6.0 KV for 0.2 sec., and light exposure through a transmission type test chart by use of a tungsten lamp as light source at a dose of about 1.5 lux.sec.

Immediately thereafter, a ⊖ charged developer (containing toner and carrier) was cascaded on the surface of the member to obtain a good toner image on the member. When the toner image on the member was transferred on a transfer paper by corona charging at ⊕5.0 KV, there was obtained a clear image of high density which was excellent in resolution as well as in gradation reproducibility.

Next, using the above image-forming member, corona charging was effected thereon at ⊖5.5 KV for 0.2 sec. in the experimental charging-exposure device, followed immediately by imagewise exposure at a dose of 1.5 lux.sec. Then, a ⊕ charged developer was cascaded on the surface of the member and transfer of the image and fixing effected on a transfer paper, whereby a very clear image was obtained.

From these results and the previous results, it can be seen that the image-forming member for electrophotography obtained in this Example has no dependency on the charging polarity but it is provided with the characteristics of a both-polarity image-forming member.

EXAMPLE 8

After intermediate layers were formed on molybdenum substrates according to the same procedure and under the same conditions as in Example 7, photoconductive layers were formed on the intermediate layers according to the same procedure and under the same conditions as in Example 7 except that the gases employed and the relative values of flow amounts were varied as shown in Table 10. When toner images were formed using the thus prepared image-forming members, better images were obtained in case of Sample A8 for the combination of corona charging effected at ⊖5.5 KV followed by imagewise exposure with a ⊕ charged toner.

On the contrary, better toner images were obtained in case of Sample B8 for the combination of corona charging at ⊕6.0 KV followed by imagewise exposure with a ⊖ charged toner.

TABLE 10

| Sample | Photoconductive layer | |
|---|---|---|
| | Gases employed for formation of photoconductive layer | Relative value of flow amount |
| A8 | $SiF_4$ | 3 |
| | $Si_2H_6$ | 28 |
| | $SiH_4$ | 1 |
| | Ar | 68 |
| B8 | $SiF_4$ | 3 |
| | $Si_2H_6$ containing 100 vol. ppm of $B_2H_6$ | 28 |
| | $SiH_4$ | 1 |
| | Ar | 68 |

EXAMPLE 9

After intermediate layers were formed on molybdenum substrates according to the same procedure and under the same conditions as in Example 7, photoconductive layers were formed on the intermediate layers according to the same procedure and under the same conditions as in Example 7 except that the gases employed (using increased number of bombs in FIG. 2, if necessary) and the relative values of flow amounts were varied as shown in Table 11.

The thus prepared image-forming members were examined from both aspects of productivity (deposition rate) and characteristics (image quality at high temperatures under high humidity, repeatability). The result revealed that it is necessary for accomplishment of the purposes of the present invention to form a photoconductive layer by use of a starting gas mixture in which high order compounds with higher order of n or m than that of the minimum order compound with the minimum order of n or m among those represented by the aforesaid formulas, (A) and (B), may be contained in an amount of at least 1 vol.% based on said minimum order compound.

TABLE 11

| Sample | Gases employed for formation of photoconductive layer | | Deposition rate of film (Å/sec.) | Repeatability by 3 sec. cycle | Image quality after standing 1 hr. at high temperature and humidity (35° C., 85% RH) |
|---|---|---|---|---|---|
| | Starting gas (relative flow amount value) | Atmospheric gas (flow amount relative to starting gas mixture) | | | |
| 9-1 | $SiH_4$(90) $Si_2H_6$(0.5) $SiF_4$(9.5) | Ar (30:70) | 15 | Δ | X |
| 9-2 | $SiH_4$(90) $Si_2H_6$(1) $SiF_4$(9) | Ar (30:70) | 18 | Δ | Δ |
| 9-3 | $SiH_4$(85) $Si_2H_6$(5) $SiF_4$(10) | Ar (30:70) | 25 | ○ | Δ |
| 9-4 | $SiH_4$(60) $Si_2H_6$(30) $SiF_4$(10) | Ar (30:70) | 45 | ○ | ○ |
| 9-5 | $SiH_4$(20) $Si_2H_6$(70) $SiF_4$(10) | Ar (30:70) | 60 | ◉ | ○ |
| 9-6 | $SiH_4$(5) $Si_2H_6$(85) $SiF_4$(10) | Ar (30:70) | 80 | ◉ | ◉ |
| 9-7 | $SiH_4$(5) $Si_2H_6$(85) $SiF_4$(10) | — | 50 | ◉ | ◉ |
| 9-8 | $SiH_4$(5) $Si_2H_6$(85) $SiF_4$(10) | $H_2$ (30:70) | 70 | ◉ | ◉ |
| 9-9 | $SiH_4$(5) $Si_2H_6$(85) $SiF_4$(10) | He (30:70) | 60 | ◉ | ◉ |
| 9-10 | $Si_2H_6$(60) $Si_3H_8$(30) $SiF_4$(10) | Ar (30:70) | 90 | ◉ | ◉ |

TABLE 11-continued

| Sample | Gases employed for formation of photoconductive layer | | Deposition rate of film (Å/sec.) | Repeatability by 3 sec. cycle | Image quality after standing 1 hr. at high temperature and humidity (35° C., 85% RH) |
| --- | --- | --- | --- | --- | --- |
| | Starting gas (relative flow amount value) | Atmospheric gas (flow amount relative to starting gas mixture) | | | |
| 9-11 | $Si_2H_6(60)$ $Si_3H_8(30)$ $Si_2F_6(10)$ | Ar (30:70) | 100 | ⊙ | ⊙ |
| 9-12 | $Si_2H_6(50)$ $Si_3H_8(25)$ $Si_4H_{10}(10)$ $Si_2F_6(15)$ | Ar (30:70) | 110 | ⊙ | ⊙ |
| 9-13 | $SiF_4(5)$ $Si_2F_6(45)$ $Si_2H_6(50)$ | Ar (30:70) | 85 | ⊙ | ⊙ |
| 9-14 | $Si_2H_6(60)$ $Si_3H_8(30)$ $SiCl_4(10)$ | Ar (30:70) | 90 | ⊙ | ⊙ |
| 9-15 | $Si_2H_6(60)$ $Si_3H_8(30)$ $SiBr_4(10)$ | Ar (30:70) | 100 | ⊙ | ⊙ |
| 9-16 | $Si_2H_6(50)$ $Si_3H_8(25)$ $Si_4H_{10}(10)$ $SiF_4(15)$ | Ar (30:70) | 100 | ⊙ | ⊙ |

Standards for evaluation:
⊙: Excellent
○: Good
Δ: Practically satisfactory
×: Practically slightly inferior

What we claim is:

1. A process for producing a photoconductive member, which comprises forming a photoconductive layer on a substrate for formation of a photoconductive layer by introducing starting substances for formation of a photoconductive layer under gaseous state into a deposition chamber maintained under a desired reduced pressure and exciting discharging under the gas atmosphere of said starting substances, characterized in that said starting substances are constituted of at least two compounds selected from the group consisting of the compounds of the formula:

$$Si_nH_{2n+2} \quad (A)$$

wherein n is a positive integer and the compounds of the formula:

$$Si_mH_lX_k \quad (B)$$

wherein m and k are positive integers, l is 0 or a positive integer, $l+k=2m+2$, and X represents a halogen atom, n and m being called "order number" hereinafter, and said starting substances to be introduced into said deposition chamber being controlled in amounts such that the proportion of the total of high order compounds is from about 20–99 vol.% based on the total of the minimum order compounds, the minimum order compound being one whose order number is the minimum among order numbers of said at least two compounds, the high order compound being one whose order number is higher than the order number of the minimum order compound.

2. A process according to claim 1 wherein the compound represented by the formula (A) is selected from the group consisting of $SiH_4$, $Si_2H_6$, $Si_3H_8$, $Si_4H_{10}$, $Si_5H_{12}$, $Si_6H_{14}$, $Si_7H_{16}$ and $Si_8H_{18}$.

3. A process according to claim 1 wherein the compound represented by the formula (B) is selected from the group consisting of $SiX_4$, $Si_2X_6$, $Si_3X_8$, $SiHX_3$, $SiH_2X_2$ and $SiH_3X$ (where X is F, Cl, Br, I).

4. A process according to claim 1 wherein the high compound is at least one selected from the group consisting of $Si_2H_6$, $Si_3H_8$ and $Si_4H_{10}$, or the group consisting of $Si_2F_6$, $Si_2Cl_6$ and $Si_3Br_8$.

5. A process according to claim 1 wherein the starting substance further contains a material for incorporation of an impurity which controls the conduction type of the photoconductive layer formed.

6. A process according to claim 5 wherein the impurity is a n-type impurity.

7. A process according to claim 5 wherein the impurity is a p-type impurity.

8. A process according to claim 5 wherein the impurity is at least one selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$.

9. A process according to claim 1 wherein the starting substances contain at least two kinds of compounds represented by the formula (A).

10. A process according to claim 1 wherein the starting substances contain at least two kinds of compounds represented by the formula (B).

11. A process according to claim 1 wherein the starting substances contain at least two kinds of compounds represented by the formula (A) and at least one kind of compounds represented by the formula (B).

12. A process according to claim 1 wherein the starting substances contain at least one kind of compounds represented by the formula (A) and at least two kinds of compounds represented by the formula (B).

13. In a process for producing a photoconductive member comprising forming a photoconductive layer on a substrate suitable for forming a photoconductive layer by introducing starting substances for forming a photoconductive layer under gaseous conditions into a deposition chamber maintained under a preselected reduced pressure and thereafter exciting discharging in the gaseous atmosphere of said starting substances, the improvement which comprises employing as the substances at least two compounds selected from the group consisting of monosilane and a compound of the formula:

$$Si_nH_{2n+2}$$

wherein n is a positive integer from 2–8 and wherein the starting substances are introduced into said deposition chamber in amounts sufficient that the proportion of $Si_nH_{2n+2}$ is from about 20 to 99 volume percent based on the total of the starting substances.

14. In a process for producing a photoconductive member comprising forming a photoconductive layer on a substrate suitable for forming a photoconductive layer by introducing starting substances for forming a photoconductive layer under gaseous conditions into a deposition chamber maintained under a preselected reduced pressure and thereafter exciting discharging in the gaseous atmosphere of said starting substances, the improvement which comprises employing as the substances at least two compounds selected from the group consisting of the compounds of the formula:

$$SiH_pX_q$$

wherein p is 0 or a positive integer, q is a positive integer and p+q is 4, and the compounds of the formula:

$$Si_rH_sX_t$$

wherein r is a positive integer of at least 2, s is 0 or a positive integer, t is a positive integer, and t+s=2r+2, X is halogen and wherein the starting substances are introduced into the deposition chamber in sufficient amounts such that the proportion of $Si_rH_sX_t$ is from about 20–99 volume percent based on the total of said starting substances.

15. In a process for producing a photoconductive member comprising forming a photoconductive layer on a substrate suitable for forming a photoconductive layer by introducing starting substances for forming a photoconductive layer under gaseous conditions into a deposition chamber maintained under a preselected reduced pressure and thereafter exciting discharging in the gaseous atmosphere of said starting substances, the improvement which comprises employing as the starting substances at least two compounds selected from the group consisting of the compounds of the formula:

$$Si_nH_{2n+2} \quad (A)$$

wherein n is a positive integer and the compounds of the formula:

$$Si_mH_lX_k \quad (B)$$

wherein m and k are positive integers, l is 0 or a positive integer, l+k=2m+2, and X represents a halogen atom, n and m being called "order number" hereinafter, and wherein said starting substances are introduced into the deposition chamber in amounts sufficient that the proportion of the total of high order compounds is from about 85 to 99% by volume based on the total of the starting substances, the minimum order compound being that whose order number is the minimum among the order numbers of said compounds, the higher order number being one whose order number is higher than the order number of the minimum order compound.

* * * * *

UNITED STATES PATENT AND TRADEMARK OFFICE
CERTIFICATE OF CORRECTION

PATENT NO. : 4,721,664            Page 1 of 2

DATED : January 26, 1988

INVENTOR(S) : ISAMU SHIMIZU, ET AL.

It is certified that error appears in the above-identified patent and that said Letters Patent is hereby corrected as shown below:

COLUMN 3

Lines 56-63 should be deleted.

COLUMN 4

Lines 22-23, "pound with the minimum order of m is preferred. ¶ In the present invention, as the starting substances for" should read --pound with the minimum order of m is preferred. ¶ In the present invention in another embodiment as the starting substance, there are employed, at least two compounds selected from 'A' and 'B', wherein 'A' is $SiH_pX_q$, wherein p is 0 or a positive integer, q is a positive integer and (p+q) is 4 and 'B' is $Si_rH_sX_t$, wherein r is a positive integer of at least 2, s is 0 or a positive integer, t is a positive integer and (t+s) is (2r+2) and X is halogen. ¶ In the present invention, as the starting substances for--.

COLUMN 20

Line 27, "high" should read --high order--.

UNITED STATES PATENT AND TRADEMARK OFFICE
CERTIFICATE OF CORRECTION

PATENT NO. : 4,721,664

DATED : January 26, 1988

INVENTOR(S) : ISAMU SHIMIZU, ET AL.

It is certified that error appears in the above-identified patent and that said Letters Patent is hereby corrected as shown below:

<u>COLUMN 22</u>

Line 31, "number being" should read --compound being--.

Signed and Sealed this

Sixth Day of September, 1988

Attest:

DONALD J. QUIGG

*Attesting Officer*     *Commissioner of Patents and Trademarks*